United States Patent
Cha

(10) Patent No.: US 8,933,493 B2
(45) Date of Patent: Jan. 13, 2015

(54) SEMICONDUCTOR DEVICE WITH HIGH VOLTAGE TRANSISTOR

(71) Applicant: SK Hynix Inc., Gyeonggi-do (KR)

(72) Inventor: Jae-Yong Cha, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 75 days.

(21) Appl. No.: 13/844,929

(22) Filed: Mar. 16, 2013

(65) Prior Publication Data

US 2014/0183644 A1    Jul. 3, 2014

(30) Foreign Application Priority Data

Dec. 27, 2012    (KR) .......................... 10-2012-0154649

(51) Int. Cl.
  *H01L 29/76* (2006.01)
  *H01L 27/088* (2006.01)
  *H01L 21/8234* (2006.01)

(52) U.S. Cl.
  CPC ....... *H01L 27/088* (2013.01); *H01L 21/823425* (2013.01)
  USPC .......................................... 257/213; 257/386

(58) Field of Classification Search
  USPC .................................. 257/213, 386
  See application file for complete search history.

(56) References Cited

U.S. PATENT DOCUMENTS 7,983,086 B2 * 7/2011 Sato et al. ................ 365/185.17
2007/0013032 A1    1/2007 Patti et al.

FOREIGN PATENT DOCUMENTS

KR    1020070013032    1/2007

* cited by examiner

*Primary Examiner* — David Vu
*Assistant Examiner* — Brandon Fox
(74) *Attorney, Agent, or Firm* — IP & T Group LLP

(57) ABSTRACT

A semiconductor device may include a first transistor, a second transistor connected in series to the first transistor through a first junction, and a third transistor connected in series to the second transistor through a second junction. Here, a high voltage is supplied to one of the first and second junctions, and a turn-off voltage is supplied to a gate of the second transistor.

15 Claims, 6 Drawing Sheets

US 8,933,493 B2

SEMICONDUCTOR DEVICE WITH HIGH VOLTAGE TRANSISTOR

CROSS-REFERENCE TO RELATED APPLICATIONS

The present application claims priority of Korean Patent Application No. 10-2012-0154649, filed on Dec. 27, 2012, which is incorporated herein by reference in its entirety.

BACKGROUND

1. Field

Exemplary embodiments of the present invention relate to semiconductor design technology, and more particularly, to a semiconductor device with a high voltage transistor.

2. Description of the Related Art

In a design of a transistor to which a high-level voltage is supplied (hereafter, referred to as a high voltage transistor), to prevent a contact melting phenomenon, regulations on the layout of the high voltage transistor have been enacted and complied. Hereinafter, the high voltage refers to a voltage high enough to melt a contact when the voltage is supplied to one end of the contact and a ground voltage is supplied to the other end of the contact. In general, the level of the high voltage may be at least 3V, and may be about 20V at its highest level. The high voltage is generated in the semiconductor device through charge pumping using a power supply voltage that is input from an outside of the semiconductor device.

FIGS. 1A to 1C are layout views illustrating a forbidden layout (FIG. 1A) and recommended layouts (FIGS. 1B and 1C). Further, FIGS. 2A to 2C are circuit diagrams illustrating transistors 110 and 120 shown in FIGS. 1A to 1C, respectively.

Referring to FIG. 1A, a high voltage VPP is supplied to one junction 111 of a drain and a source of the transistor 110, and a ground voltage VSS is supplied to the other junction 112 thereof. Further, the high voltage VPP is supplied to one junction 121 of a drain and a source of the transistor 120, and the ground voltage VSS is supplied to the other junction 122 thereof. A voltage INPUT_A is supplied to a gate of the transistor 110 and a voltage INPUT_B is supplied to a gate of the transistor 120. The junction 112 of the transistor 110, to which the ground voltage VSS is supplied, and the junction 121 of the transistor 120, to which the high voltage VPP is supplied, are adjacent to each other. Since the voltage difference between the adjacent junctions 112 and 121 is as high as the high voltage VPP, the contact melting may occur between the junctions 112 and 121, and thus the layout shown in FIG. 1A is not used.

Referring to FIG. 13, the junction 111 of the transistor 110 and the junction 121 of the transistor 120 are shared. Since the high voltage VPP is identically supplied to the junctions 111 and 121, the voltage difference between the junctions 111 and 121 becomes 0V. Accordingly, in the layout of FIG. 1B, the contact melting may not occur, and the layout is used as a recommended layout (or guide layout).

Referring to FIG. 1C, the junction 112 of the transistor 110 and the junction 122 of the transistor 120 are disposed adjacent to each other. Since the voltage difference between the adjacent junctions 112 and 122 is 0V, the contact melting may not occur in the layout. Accordingly, the layout shown in FIG. 1C is also used as the recommended layout. For reference, the junctions 112 and 122 of the transistors 110 and 120 may be designed to be shared.

As described above, the high voltage transistor should be designed along the recommended layout to avoid the forbidden layout. However, in the case where the design is made to be complied with only the recommended layout, there are many limitations in the degree of freedom of the design, and more fundamental solution to the above concerns is in demand.

SUMMARY

Exemplary embodiments of the present invention are directed to a semiconductor device that may heighten the degree of freedom in designing a high voltage transistor.

In an embodiment, a semiconductor device may include a first transistor, a second transistor connected in series to the first transistor through a first junction, and a third transistor connected in series to the second transistor through a second junction. Here, a high voltage is supplied to one of the first junction and second junctions, and a turn-off voltage is supplied to a gate of the second transistor.

In an embodiment, a semiconductor device may include a first transistor having a first junction to which a high voltage is supplied, a second transistor sharing a first junction with the first transistor and having a gate to which a turn-off voltage is supplied, and a third transistor sharing a second junction of the second transistor.

In an embodiment, a semiconductor device may include a first dummy transistor formed on a substrate, a first transistor formed on the substrate and sharing a first junction with the first dummy transistor, and a second transistor formed on the substrate and sharing a second junction with the first dummy transistor. Here, a high voltage is supplied to one of the first junction and the second junction of the first dummy transistor, and the first dummy transistor is kept in a turn-off state.

In accordance with the embodiments of the present invention, the contact melting between the adjacent junctions may be prevented using the transistor that keeps the turn-off state, and thus the degree of freedom of circuit design using the high voltage transistors may be increased.

DETAILED DESCRIPTION

Figure 1A:
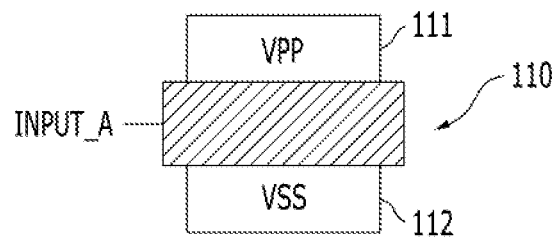
FIGS. 1A to 1C are layout views illustrating a forbidden layout and recommended layouts.
Figure 1A:
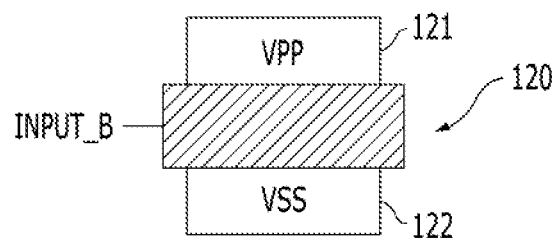
Figure 1B:
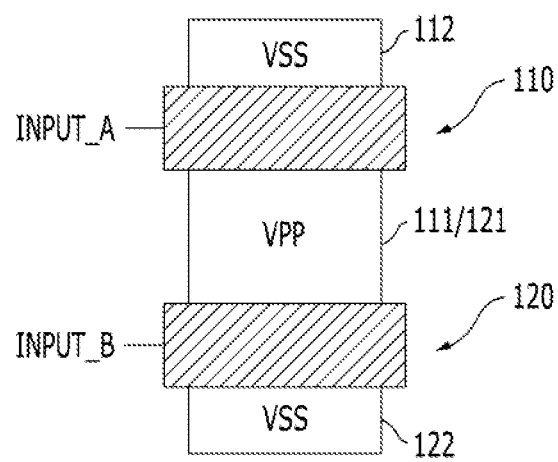
Figure 1C:
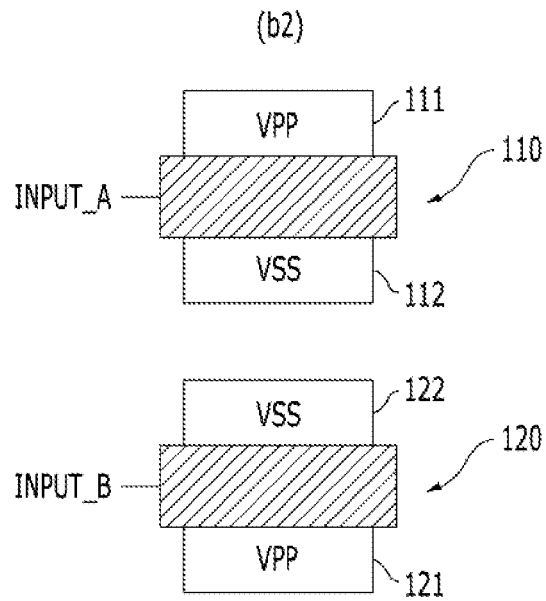
Figure 2A:
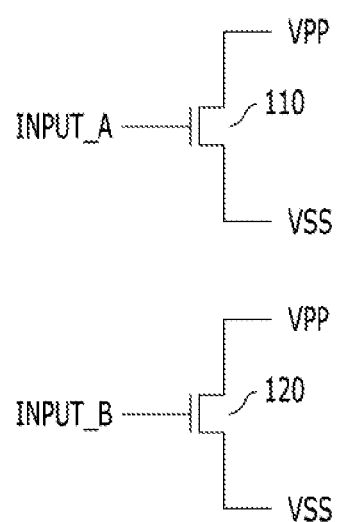
FIGS. 2A to 2C are circuit diagrams illustrating transistors shown in FIGS. 1A to 1C, respectively.
Figure 2B:
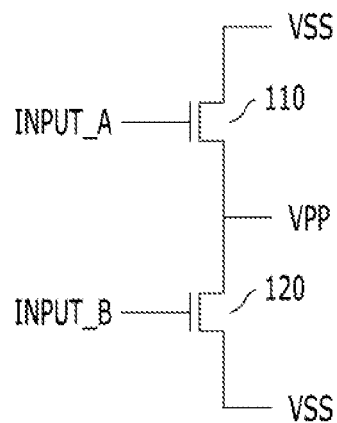
Figure 2C:
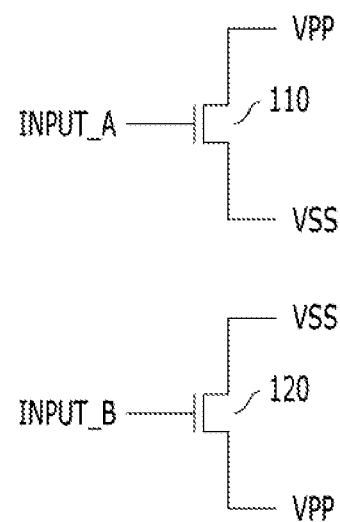

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. Further, the drawings are not necessarily to scale and in some instances, proportions may have been exaggerated to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 3:
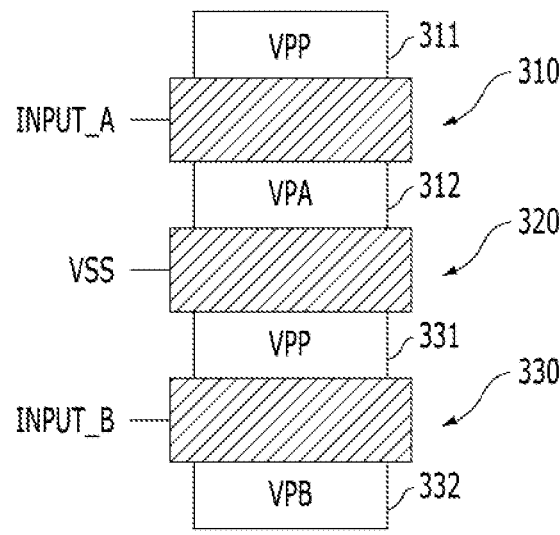
FIG. 3 is a layout view illustrating the configuration of a semiconductor device in accordance with an embodiment of the present invention.
Figure 4:
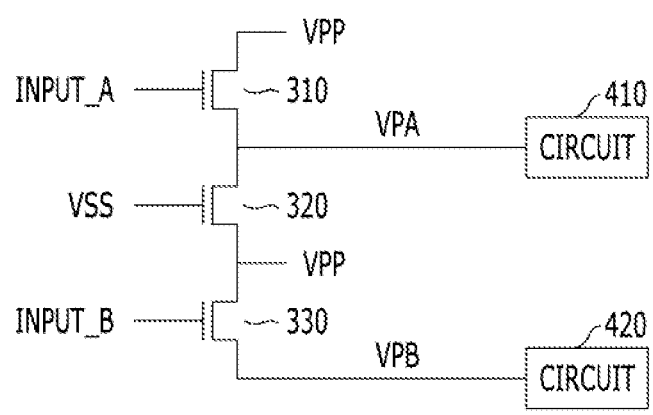
FIG. 4 is a circuit diagram illustrating the semiconductor device shown in FIG. 3.

FIG. 3 is a layout view illustrating the configuration of a semiconductor device in accordance with an embodiment of the present invention, and FIG. 4 is a circuit diagram illustrating the semiconductor device shown in FIG. 3.

Referring to FIG. 3, a semiconductor device includes transistors 310, 320, and 330. A high voltage VPP is supplied to one junction 311 of the transistor 310, and the other junction 312 is connected to a node VPA. Here, when a voltage INPUT_A that is input to a gate of the transistor 310 is a turn-on voltage, the high voltage VPP is supplied to the node VPA, and when the voltage INPUT_A is a turn-off voltage, a voltage having a level of a ground voltage VSS to the high voltage VPP is supplied to the node VPA based on an operation of another circuit (e.g., circuit 410 in FIG. 4) that is not illustrated in FIG. 3.

The high voltage VPP is supplied to one junction 331 of the transistor 330, and the other junction 332 is connected to a node VPB. Here, when a voltage INPUT_B that is input to a gate of the transistor 330 is a turn-on voltage, the high voltage VPP is supplied to the node VPB When the voltage INPUT_B is a turn-off voltage, a voltage having a level of the ground voltage VSS to the high voltage VPP is supplied to the node VPB based on an operation of another circuit (e.g., circuit 420 in FIG. 4) that is not illustrated in FIG. 3.

In accordance with only the layout of the transistor 310 and the transistor 330, since the junction 312 of the transistor 310 and the junction 331 of the transistor 320 are disposed adjacent to each other and the voltage difference between the two junctions 312 and 331 may be as high as the high voltage VPP, a contact melting may occur between the two junctions 312 and 331. However, in accordance with the embodiment of the present invention, the transistor 320 is formed in series between the transistor 310 and the transistor 330, and thus the transistor 320 may prevent the contact melting between the two junctions.

The transistor 320 shares the one junction 312 with the transistor 310, and shares the other junction 331 with the transistor 320. The ground voltage VSS that is the turn-off voltage for turning off the transistor 320 may be supplied to the gate of the transistor 320, and thus the transistor 320 continuously keeps a turn-off state. Since the transistor 320 keeps the turn-off state, current flow between the junctions 312 and 331 is intercepted, and thus the contact melting between the junctions 312 and 331 may be prevented. That is, the transistor 320 is a kind of dummy transistor that keeps the turn-off state to intercept the current flow between the junctions 312 and 331, and thus the contact melting may be prevented.

Figure 5:
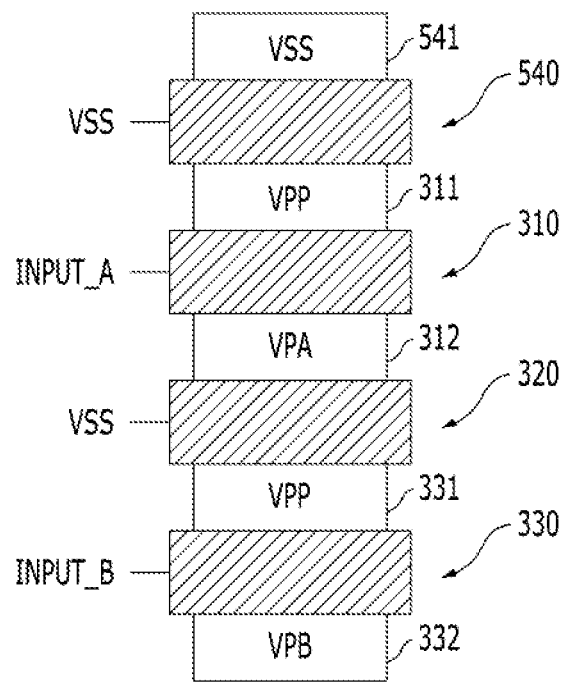
FIG. 5 is a layout view illustrating the configuration of a semiconductor device in accordance with another embodiment of the present invention.
Figure 6:
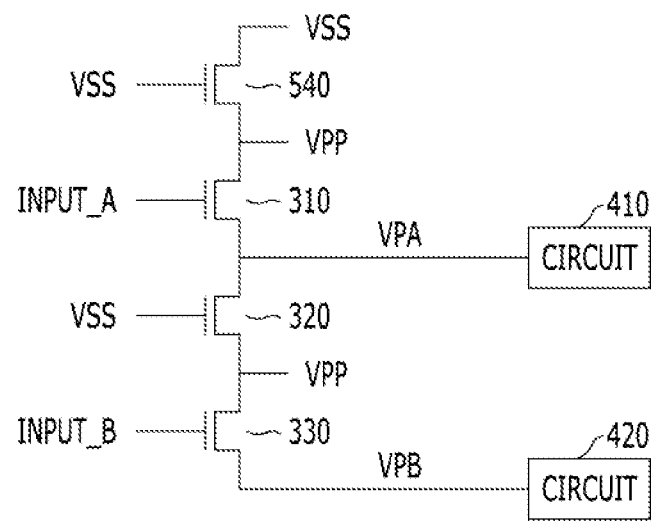
FIG. 6 is a circuit diagram illustrating the semiconductor device shown in FIG. 5.

FIG. 5 is a layout view illustrating the configuration of a semiconductor device in accordance with another embodiment of the present invention, and FIG. 6 is a circuit diagram illustrating the semiconductor device shown in FIG. 5.

Referring to FIG. 5, the semiconductor device further includes a transistor 540 in addition to the transistors 310, 320, and 330 shown in FIG. 3. The transistor 540 shares the one junction 311 of the transistor 540 with the transistor 310, and the ground voltage VSS is supplied to the other junction 541 thereof. Further, the ground voltage VSS that is the off voltage is supplied to the gate of the transistor 310. The transistor 540 keeps the turn-off state, and prevents current leakage from the junction 311, where the high voltage VPP is supplied, to other regions.

Since the transistor 540 is provided to prevent the current leakage from the junction 311, the junction 541 of the transistor 540 may not be defined. That is, in fabricating the semiconductor device, the junction 541 of the transistor 540 may not be formed.

Figure 7:
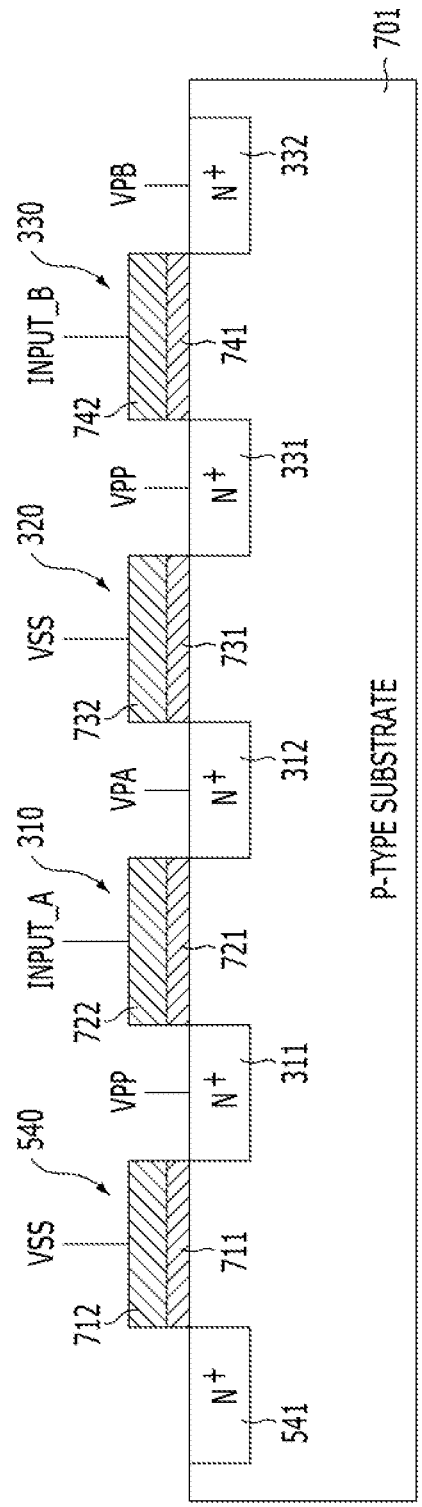
FIG. 7 is a cross-sectional view illustrating transistors shown in FIG. 5.

FIG. 7 is a cross-sectional view illustrating transistors 310, 320, 330, and 540 shown in FIG. 5.

Referring to FIG. 7, N-type junctions 311, 312, 331, 332, and 541 of the transistors 310, 320, 330, and 540 are formed in a P-type substrate 701. Here, the junction 541 of the transistor 540 may be omitted.

The gates of the transistors 310, 320, 330, and 540 are formed of gate insulating films 711, 721, 731, and 741 formed on the substrate and gate electrodes 712, 722, 732, and 742 formed on the gate insulating films 711, 721, 731, and 741. Since the transistors 310, 320, 330, and 540 are high voltage NMOS transistors (HVN) that transfer or intercept the high voltage VPP, the thickness of the gate insulating films 711, 721, 731, and 741 may be relatively thick.

In accordance with the present invention, the contact melting phenomenon may be prevented by inserting the dummy transistor 320 that keeps the turn-off state in the region where the contact melting phenomenon may occur. Accordingly, it may be possible to design the circuit with the forbidden layout as illustrated in FIG. 1A, and this may increase the degree of freedom of the circuit design greatly.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device comprising:
a first transistor;
a second transistor connected in series to the first transistor through a first junction; and
a third transistor connected in series to the second transistor through a second junction,
wherein a high voltage is supplied to one of the first and second junctions, and a turn-off voltage is supplied to a gate of the second transistor.

2. The semiconductor device of claim 1, wherein the high voltage and the turn-off voltage are fixed voltages.

3. The semiconductor device of claim 1, wherein the first transistor and the third transistor are turned on/off based on levels of voltages supplied to respective gates of the first transistor and the third transistor.

4. The semiconductor device of claim 1, wherein the contact, to which the high voltage is supplied, of the first contact and the second contact is the second contact, and the semiconductor device further comprises a fourth transistor connected in series to the first transistor through a third contact to which the high voltage is supplied.

5. The semiconductor device of claim 4, wherein a source junction of the fourth transistor is not defined.

6. A semiconductor device comprising:
   a first transistor having a first junction to which a high voltage is supplied;
   a second transistor sharing a first junction with the first transistor and having a gate to which a turn-off voltage is supplied; and
   a third transistor sharing a second junction of the second transistor.

7. The semiconductor device of claim 6, wherein the high voltage is supplied to a first junction of the third transistor.

8. The semiconductor device of claim 6, wherein the high voltage is a fixed voltage, and the turn-off voltage is a ground voltage.

9. The semiconductor device of claim 6, wherein the first transistor and the third transistor are turned on/off based on levels of voltages supplied to respective gates of the first transistor and the third transistor.

10. The semiconductor device of claim 7, further comprising a fourth transistor sharing a second junction with the third transistor and having a gate to which the off voltage is supplied.

11. The semiconductor device of claim 10, wherein a source junction of the fourth transistor is not defined.

12. A semiconductor device comprising:
    a first dummy transistor formed on a substrate;
    a first transistor formed on the substrate and sharing a first junction with the first dummy transistor; and
    a second transistor formed on the substrate and sharing a second junction with the first dummy transistor,
    wherein a high voltage is supplied to one of the first junction and the second junction of the first dummy transistor, and the first dummy transistor is kept in a turn-off state.

13. The semiconductor device of claim 12, wherein a ground voltage is supplied to a gate of the first dummy transistor.

14. The semiconductor device of claim 13, further comprising a second dummy transistor sharing a second junction with the first transistor and having a gate to which the off voltage is supplied.

15. The semiconductor device of claim 14, wherein the second dummy transistor include a first junction to which a ground voltage is supplied.

* * * * *

UNITED STATES PATENT AND TRADEMARK OFFICE
CERTIFICATE OF CORRECTION

| | | |
|---|---|---|
| PATENT NO. | : 8,933,493 B2 | Page 1 of 1 |
| APPLICATION NO. | : 13/844929 | |
| DATED | : January 13, 2015 | |
| INVENTOR(S) | : Jae-Yong Cha | |

It is certified that error appears in the above-identified patent and that said Letters Patent is hereby corrected as shown below:

Title Page, Item (56)

Change the References Cited section as follows:

References Cited

U.S. PATENT DOCUMENTS 7,983,086 B2*   7/2011   Sato et al. ............ 365/185.17
2007/0013032 A1   1/2007   Patti et al.
2007/0296485      12/2007  Ashida et al.

FOREIGN PATENT DOCUMENTS

KR   100665850       1/2007
 KR   1020070013032  1/2007

Signed and Sealed this
Fourteenth Day of April, 2015

Michelle K. Lee
*Director of the United States Patent and Trademark Office*